United States Patent
Berman et al.

(10) Patent No.: US 6,743,979 B1
(45) Date of Patent: Jun. 1, 2004

(54) BONDING PAD ISOLATION

(75) Inventors: Michael J. Berman, West Linn, OR (US); Aftab Ahmad, Lake Oswego, OR (US); Qwai H. Low, Cupertino, CA (US); Chok J. Chia, Cupertino, CA (US); Ramaswamy Ranganathan, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/652,453

(22) Filed: Aug. 29, 2003

(51) Int. Cl.⁷ .................................................. H05K 5/06
(52) U.S. Cl. ........................ 174/52.2; 257/784; 257/787
(58) Field of Search ............................... 174/52.2, 52.4; 257/784, 787

(56) References Cited

U.S. PATENT DOCUMENTS

| | | | | |
|---|---|---|---|---|
| 5,900,676 A | * | 5/1999 | Kweon et al. | 257/787 |
| 5,986,340 A | * | 11/1999 | Mostafazadeh et al. | 257/713 |
| 6,069,407 A | * | 5/2000 | Hamzehdoost | 257/774 |
| 6,462,421 B1 | * | 10/2002 | Hsu et al. | 257/777 |
| 6,468,834 B1 | * | 10/2002 | Hamzehdoost | 438/119 |
| 6,670,692 B1 | * | 12/2003 | Shih et al. | 257/532 |

* cited by examiner

*Primary Examiner*—Hung V. Ngo
(74) *Attorney, Agent, or Firm*—Luedeka, Neely & Graham, P.C.

(57) ABSTRACT

An integrated circuit, including a substrate with circuitry formed therein, where the substrate has a peripheral edge. Also included are a top most electrically conductive layer and an underlying electrically conductive layer. Outer bonding pads are disposed in an outer ring, and are formed within the top most layer. Inner bonding pads are disposed in an inner ring, and are formed within the top most layer. Inner connectors electrically connect the inner bonding pads to the circuitry. The inner connectors are formed within the underlying layer, and have a width that is less than the width of the inner bonding pads, thereby defining a gap between the inner connectors. Outer connectors electrically connect the outer bonding pads to the circuitry. The outer connectors are formed within the underlying layer, and have a width that is less than the width of the gap between the inner connectors.

20 Claims, 2 Drawing Sheets

BONDING PAD ISOLATION

FIELD

This invention relates to the field of integrated circuit fabrication. More particularly, this invention relates to reducing the amount of surface area on a die required for an integrated circuit.

BACKGROUND

The sizes of the various components and structures that are formed during an integrated circuit fabrication process are continually being reduced. This reduction in the size of the various elements of the integrated circuit tends to result in a general reduction in the overall size of the integrated circuit. For example, an integrated circuit with one million transistors can fit within the surface area of a much smaller die than it could have just a few years ago. Alternately, within a given die size, a greater number of transistors and other structures can now be fabricated than was previously possible.

However, such advances in reducing the size of the elements of an integrated circuit have not come without a myriad of new challenges. For example, one such challenge has been to provide a sufficient number of electrical contacts for the connections between the integrated circuit and the package substrate or other structure to which it is electrically connected. As the number of transistors within the integrated circuit has increased, so too has the required number of bonding pads on the integrated circuit increased. The space required by this explosion in the number of bonding pads has somewhat offset the gains that have been won in reducing the space required for the active circuitry.

Several methods have been devised to reduce the total amount of space required for the greater number of bonding pads. For example, instead of having bonding pads located just at the peripheral portions of the die, bonding pads have been moved to interior portions of the integrated circuit, which is then mounted with solder bumps as a flip chip. However, it is preferable in some applications to have wire bonded integrated circuits rather than bump mounted flip chip integrated circuits. Another method has been to provide multiple concentric rings or rows of bonding pads around the peripheral edge of the die, rather than just the single ring that was sufficient for a smaller number of transistors. However, the surface area on the die required for the electrically conductive connections between the outer rings of bonding pads tends to reduce the amount of space available for the inner rings of bonding pads, thus offsetting some of the gains that are realized by having multiple rings of bonding pads.

One way to somewhat alleviate this condition is to reduce the width of the bonding pads on the inner rings, which allows more space on the surface of the integrated circuit for the electrical connections to the bonding pads in the outer rings. However, reducing the width of a bonding pad makes it more difficult to bond to. Thus, there is a practical limit, dictated at least in part by the state of the art of wire bonding equipment and wire bonding techniques, as to how narrow a bonding pad can be made. This practical limit puts a cap on the gains that can be realized by reducing the width of the bonding pad to reduce the total amount of space required by the bonding pads.

What is needed, therefore, is an integrated circuit design that provides an increased number of bonding pads at the peripheral edge of the integrated circuit.

SUMMARY

The above and other needs are met by an integrated circuit, including a substrate with circuitry formed therein, where the substrate has a peripheral edge. Also included are a top most electrically conductive layer and an underlying electrically conductive layer. Electrically conductive outer bonding pads are disposed in an outer ring adjacent the peripheral edge of the substrate. The outer bonding pads are formed within the top most electrically conductive layer, and have a first width. Electrically conductive inner bonding pads are disposed in an inner ring interior to and concentric with the outer ring of bonding pads. The inner bonding pads are formed within the top most electrically conductive layer, and have a second width.

Electrically conductive inner connectors electrically connect the inner bonding pads to the circuitry. The inner connectors are formed within the underlying electrically conductive layer, and have a third width that is less than the second width of the inner bonding pads, thereby defining a gap having a fourth width between the inner connectors. Electrically conductive outer connectors electrically connect the outer bonding pads to the circuitry. The outer connectors are formed within the underlying electrically conductive layer, and have a fifth width that is less than the fourth width of the gap between the inner connectors.

By placing the inner and outer connectors of the bonding pads on an underlying electrically conductive layer in this manner, the connectors can be narrower than the bonding pads. This enables the bonding pads to be left at a width that is easily sufficient for good wire bonding. However, the connectors, being narrower than the bonding pads, have sufficient room between them for the routing of other connectors. Specifically, the narrower connectors for the inner row of bonding pads have sufficient space between them for the routing of the connectors for the outer row of bonding pads. Thus, the bonding pads of the inner row can be placed directly adjacent one another, and no space is lost between them for routing of the outer connectors. Thus, there is more space for larger bonding pads.

In various embodiments, adjacent ones of the inner bonding pads are disposed at a pitch that is narrower than the fifth width of the outer connectors. Preferably, the first width of the outer bonding pads is equal to the second width of the inner bonding pads. Adjacent ones of the outer bonding pads are disposed at a first pitch and adjacent ones of the inner bonding pads are disposed at a second pitch and the first pitch is preferably equal to the second pitch. Preferably, the underlying electrically conductive layer is a first electrically conductive layer below the top most electrically conductive layer. The outer ring of bonding pads and the inner ring of bonding pads preferably include all bonding pads of the integrated circuit. Preferably, the inner ring of bonding pads is disposed over the circuitry of the integrated circuit. The outer ring of bonding pads may also be disposed over the circuitry of the integrated circuit. In one embodiment the inner connectors comprise vias to the circuitry. Also described is a packaged integrated circuit including the integrated circuit as described above.

According to another aspect of the invention there is described an integrated circuit, including a substrate with circuitry formed therein, where the substrate has a peripheral edge. Also included is a top most electrically conductive layer and an underlying electrically conductive layer. Electrically conductive outer bonding pads are disposed in an outer ring adjacent the peripheral edge of the substrate. The outer bonding pads are formed within the top most electrically conductive layer, and have a first width. Electrically conductive inner bonding pads are disposed in an inner ring interior to and concentric with the outer ring of bonding pads. The inner bonding pads are formed within the top most electrically conductive layer, have a second width, and are disposed over the circuitry of the integrated circuit.

Electrically conductive inner connectors electrically connect the inner bonding pads to the circuitry without routing between the outer bonding pads. The inner connectors are formed within the underlying electrically conductive layer. Electrically conductive outer connectors electrically connect the outer bonding pads to the circuitry without routing between the inner bonding pads. The outer connectors are formed within the underlying electrically conductive layer.

With the inner bonding pads so disposed over the circuitry, it is unnecessary for either the inner connectors or the outer connectors to route by one another. In this manner, there is sufficient space for the inner bonding pads to be placed directly adjacent one another, and also for the outer bonding pads to be placed directly adjacent one another. Thus, less total space is used for the bonding pads, and the bonding pads can be formed at a size that is sufficient for good wire bonding.

In various embodiments, the first width of the outer bonding pads is equal to the second width of the inner bonding pads. Adjacent ones of the outer bonding pads are disposed at a first pitch and adjacent ones of the inner bonding pads are disposed at a second pitch and the first pitch is preferably equal to the second pitch. In one embodiment the inner connectors comprise vias to the circuitry. Also described is a packaged integrated circuit including the integrated circuit described above.

According to yet another aspect of the invention there is described an integrated circuit, including a substrate with circuitry formed therein, where the substrate has a peripheral edge. Also included is a top most electrically conductive layer and an underlying electrically conductive layer. Electrically conductive outer bonding pads are disposed in an outer ring adjacent the peripheral edge of the substrate. The outer bonding pads are formed within the top most electrically conductive layer, and have a first width. The outer bonding pads are disposed over the circuitry of the integrated circuit. Electrically conductive inner bonding pads are disposed in an inner ring interior to and concentric with the outer ring of bonding pads. The inner bonding pads are formed within the top most electrically conductive layer, and have a second width. The inner bonding pads are disposed over the circuitry of the integrated circuit.

Electrically conductive outer connectors electrically connect the outer bonding pads to the circuitry. The outer connectors are formed within the underlying electrically conductive layer, and have a fifth width that is less than the first width of the outer bonding pads, thereby defining a gap having a fourth width between the outer connectors. Electrically conductive inner connectors electrically connect the inner bonding pads to the circuitry. The inner connectors are formed within the underlying electrically conductive layer, and have a third width that is less than the fifth width of the gap between the outer connectors.

This embodiment is similar to the first embodiment described above, except that both the inner ring and the outer ring of bonding pads are disposed over the circuitry, and the narrower outer connectors provide sufficient space for the inner connectors to route between them to connect to the circuitry. Thus, the bonding pads of the outer row can be placed directly adjacent one another, and no space is lost between them for routing of the inner connectors. Thus, there is more space for larger bonding pads.

In various embodiments, adjacent ones of the outer bonding pads are disposed at a pitch that is narrower than the third width of the inner connectors. The first width of the outer bonding pads is preferably equal to the second width of the inner bonding pads. Adjacent ones of the outer bonding pads are disposed at a first pitch and adjacent ones of the inner bonding pads are disposed at a second pitch and the first pitch is preferably equal to the second pitch. Also described is a packaged integrated circuit including the integrated circuit as described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
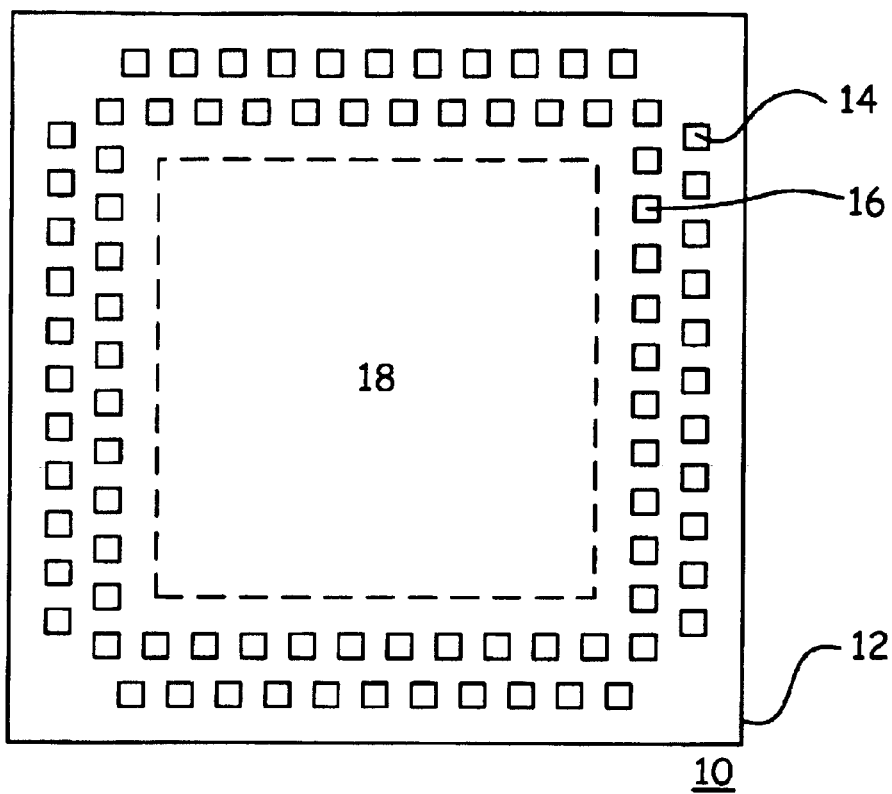
FIG. 1 is a top plan view of an integrated circuit, depicting a substrate with a peripheral edge, an inner ring of bonding pads, an outer ring of bonding pads, and a core portion.

With reference now to FIG. 1, there is depicted a top plan view of an integrated circuit 10, depicting a substrate with a peripheral edge 12, an inner ring of bonding pads 16, an outer ring of bonding pads 14, and a core portion 18. As depicted in FIG. 1, the bonding pads 16 of the inner ring are offset from the bonding pads 14 of the outer ring. Although this is not mandatory in the various embodiments, in some embodiments it provides for more direct routing of the electrically conductive connectors that electrically connect the bonding pads 14 and 16 to the circuitry of the integrated circuit 10, primarily the input output circuitry. However, it is also possible to align the bonding pads 16 of the inner ring with the bonding pads 14 of the outer ring. It is appreciated that the number, size, and configuration of the bonding pads 14 and 16 and the integrated circuit 10 as depicted in FIG. 1 are representative only, and not by way of limitation.

Figure 2:
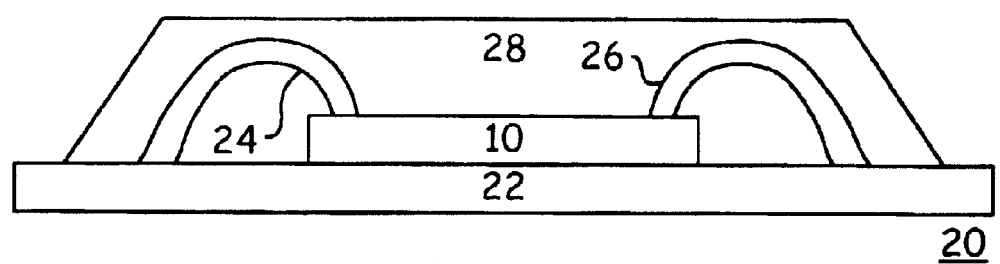
FIG. 2 is a cross sectional view of a packaged integrated circuit, depicting an integrated circuit, package substrate, wire bonds, and encapsulant.

FIG. 2 depicts a cross sectional view of a packaged integrated circuit 20, including the integrated circuit 10, package substrate 22, wire bonds 24 and 26, and an encapsulant 28. Again, the embodiment of FIG. 2 is not meant to be by way of limitation, but rather is representative of a packaged integrated circuit 20. Depicted are a first row of bonded wires 24 which electrically connect the package substrate 22 to the outer ring of bonding pads 14 and a second row of bonded wires 26 which electrically connect the package substrate 22 to the inner ring of bonding pads 16. The encapsulant 28 as depicted in FIG. 1 is a formed material, but it is appreciated that in alternate embodiments the encapsulant 28 could take on other forms, such as a hermitic lid. It is also appreciated that the present invention is also applicable to flip chip integrated circuits. However, the embodiments described herein are of most benefit to wire bonding integrated circuits that have rings of bonding pads at their peripheral edges.

Figure 3:
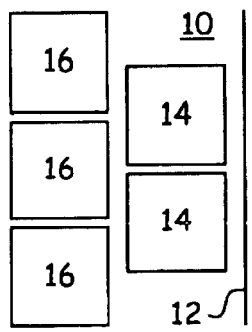
FIG. 3 is a top plan view of a portion of a top most electrically conductive layer having bonding pads in an inner ring and an outer ring, where all of the connectors are on an underlying electrically conductive layer.

With reference now to FIG. 3, there is depicted a top plan view of a portion of a top most electrically conductive layer having bonding pads 16 and 14 in an inner ring and an outer ring respectively. Also depicted is the peripheral edge 12 of the integrated circuit 10, for reference. As can be seen in FIG. 3, on the top most layer there are no electrically conductive connectors for electrically connecting the bonding pads 14 and 16 to the circuitry of the integrated circuit 10. Thus, in the embodiment depicted in FIG. 3, all of the connectors are disposed on underlying electrically conductive layers.

Figure 4:
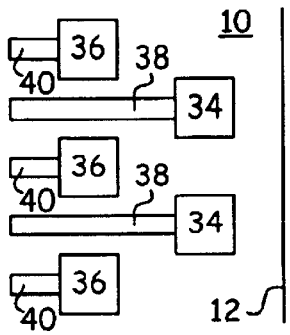
FIG. 4 is a top plan view of a portion of an underlying electrically conductive layer, where all of the connectors are disposed on the underlying electrically conductive layer.

FIG. 4 depicts a top plan view of a portion of an underlying electrically conductive layer, where all of the connectors 38, 40, 34, and 36 are disposed on the underlying electrically conductive layer. As depicted in FIG. 4, the connectors 34 and 36 are sized somewhat smaller than the bonding pads 14 and 16 which they underlie. This is done for a variety of reasons. First, it is desirable to place the bonding pads 14 and 16 as close to one another as possible, so as to fit a greater number of bonding pads within a given amount of space. Thus, in the embodiment depicted in FIG. 1, there is no room for connectors on the top most electrically conductive layer. Further, it is desired to keep the bonding pads 14 and 16 as large in size as possible, so that they can be more easily bonded to. It is also desirable to have the connector 34 and 36 sized as close to the size of the bonding pads 14 and 16 as practical, within the constrains as described herein, so that they provide good structural support for the bonding pads 14 and 16, and good electrical conductivity at a relatively low resistance.

However, the connectors 34 and 36 on the underlying electrically conductive layer can be made somewhat smaller than the bonding pads 14 and 16 on the top most electrically conductive layer, which allows room for the connectors 38 to be routed between the connectors 36, even though the bonding pads 14 and 16 are disposed as close together as practical, one to another. In other words, the bonding pads 14 and 16 can be very close together, without concern for finding space on the top most layer for routing the connectors, because the connectors 38 and 40 are moved down to the underlying layer, and the connectors 34 and 36 are reduced in size to accommodate the routing of the connectors 38 and 40.

Figure 8:
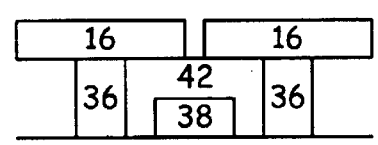
FIG. 8 is a cross sectional view depicting the outer connectors for the outer ring of bonding pads disposed underneath the inner ring of bonding pads.

By way of further clarification, FIG. 8 depicts one of the outer connectors 38 for the outer ring of bonding pads 14 disposed between the inner connectors 36 and underneath the inner ring of bonding pads 16, and embedded in electrically insulating material 42. As depicted in FIG. 8, there is not enough room between the bonding pads 16 for the connector 38, if the connector 38 was disposed on the same level as the bonding pads 16. However, by forming the connectors 36 to be narrower than the bonding pads 16, there is sufficient space for the connectors 38 to reside on the same level as connectors 36.

It is appreciated that there can be an extreme number of permutations formed from the variety of different factors of the invention described herein. The different factors include, for example, size of bonding pads, spacing or pitch of bonding pads, offset of bonding pads from one row to the next, the number of rows of bonding pads, some connectors on the top most layer, some connectors on the underlying layer, the direction in which the connectors run to connect to the circuitry of the integrated circuit, and whether or not the bonding pads are formed over the circuitry, such as the input output circuitry. It is appreciated that not all of the different permutations can be depicted in the figures, because of the tremendous number of figures that would be required. However, the different levels of the factors are generally described herein.

Figure 5:
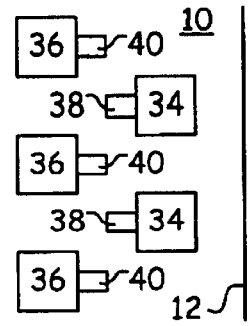
FIG. 5 is a top plan view of an alternate embodiment of a portion of an underlying electrically conductive layer, where all of the connectors are disposed on the underlying electrically conductive layer.

For example, FIG. 5 depicts an embodiment where the connectors 38 and 40 on the underlying electrically conductive layer are routed to a position that is between the inner row and the outer row. In this embodiment, the inner row of bonding pads 16 is preferably placed above the circuitry of the integrated circuit 10, such as above the input output circuitry. Preferably, the outer row of bonding pads 14 is not disposed above the input output circuitry in an embodiment such as depicted, although it may be. In the embodiment depicted in FIG. 4, preferably neither the inner ring of bonding pads 16 nor the outer ring of bonding pads 14 are disposed over the circuitry of the integrated circuit 10, although again, either or both may be.

Figure 6:
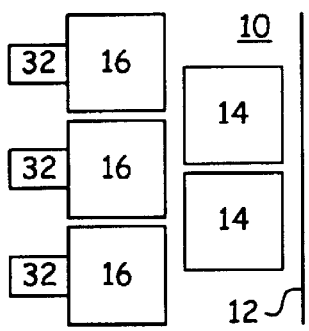
FIG. 6 is a top plan view of a portion of a top most electrically conductive layer having bonding pads in an inner ring and an outer ring, where the inner connectors for the inner ring of bonding pads are on the top most electrically conductive layer and the outer connectors for the outer ring of bonding pads are on an underlying electrically conductive layer.
Figure 7:
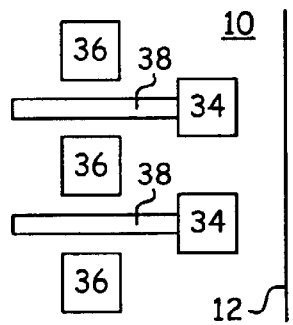
FIG. 7 is a top plan view of a portion of an underlying electrically conductive layer, where the outer connectors for the outer ring of bonding pads are disposed on the underlying electrically conductive layer.

FIG. 6 depicts an embodiment where some of the connectors 32 for the inner ring of bonding pads 16 are disposed on the top most electrically conductive layer, but the connectors 38 for the outer ring of bonding pads 14 are disposed on the underlying electrically conductive layer, as depicted in FIG. 7. In the embodiments represented in FIGS. 6 and 7, the inner ring of bonding pads 16 may be, but more preferably are not, disposed over the circuitry, and the outer ring of bonding pads 14 are preferably not disposed over the circuitry.

Figure 9:
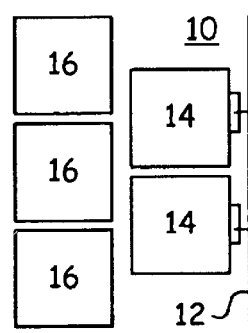
FIG. 9 is a top plan view of a portion of a top most electrically conductive layer having bonding pads in an inner ring and an outer ring, where the inner connectors for the inner ring of bonding pads are on an underlying electrically conductive layer and the outer connectors for the outer ring of bonding pads are on the top most electrically conductive layer.
Figure 10:
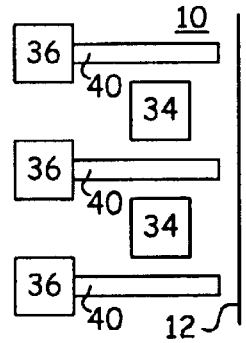
FIG. 10 is a top plan view of a portion of an underlying electrically conductive layer, where the inner connectors for the inner ring of bonding pads are disposed on the underlying electrically conductive layer.

FIG. 9 represents the embodiments where the connectors 30 for the outer ring of bonding pads 14 are disposed on the top most electrically conductive layer, but the connectors 40 for the inner ring of bonding pads 16 are disposed on the underlying electrically conductive layer, as depicted in FIG. 10. In the embodiments represented in FIGS. 9 and 10, both the inner ring of bonding pads 16 and the outer ring of bonding pads 14 are preferably disposed over the circuitry.

Figure 11:
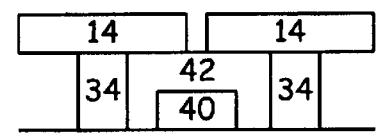
FIG. 11 is a cross sectional view depicting the inner connectors for the inner ring of bonding pads disposed underneath the outer ring of bonding pads.

By way of further clarification, FIG. 11 depicts one of the inner connectors 40 for the inner ring of bonding pads 16 disposed between the outer connectors 34 and underneath the outer ring of bonding pads 14, and embedded in electrically insulating material 42. As depicted in FIG. 11, there is not enough room between the bonding pads 14 for the connector 40, if the connector 40 was disposed on the same level as the bonding pads 14. However, by forming the connectors 34 to be narrower than the bonding pads 14, there is sufficient space for the connectors 40 to reside on the same level as connectors 34.

In yet another embodiment, the connectors from the bonding pads to the circuitry are in the form of vias that merely conduct a signal down through the underlying layers from the bonding pad to the underlying circuitry. Thus, in those embodiments the bonding pad so connected by a via to the circuitry does indeed overlie the circuitry.

Embodiments where all of the bonding pads overlie the circuitry, most notably the input output circuitry, are the most preferred. The reason for this is that by so doing, the "real estate" of the integrated circuit 10 is put to better use, with the bonding pad up on the surface, and the input output circuitry disposed below the bonding pad. In other configurations where there is no circuitry disposed beneath the bonding pad, a greater amount of surface area is required, which means that a larger die size is required for an integrated circuit of a given capacity. In addition, embodiments where the bonding pads 14 and 16 are on the top most electrically conductive layer, and the connectors are all on underlying electrically conductive layers, are also especially preferred.

Another especially preferred embodiment is represented by the combination of the embodiments represented by FIGS. 3 and 7. In this combination, none of the connectors are on the top most electrically conductive layer, and thus the bonding pads 14 and 16 can be placed as close together and sized as large as is practical under the specific circumstances of the given integrated circuit design. The inner ring of bonding pads 16 is preferably disposed over the input output circuitry, and is connected to the input output circuitry by vias. The connectors 38 for the outer ring of bonding pads 14 are able to be routed past the underlying connectors 36 for the inner ring of bonding pads 16, because the connectors 36 are sized somewhat smaller than the overlying bonding pads 16. Thus, the connectors 38 actually underlie, at least in part, the bonding pads 16, which makes extremely efficient use of the available space of the integrated circuit 10.

In one especially preferred embodiment, the connectors 36 are reduced in width to allow for routing of the connectors 38 between them, but the connectors 34, which do not having connectors from the inner ring routed between them, are not reduced in width. This embodiment is applicable both to the configuration as depicted in FIG. 7 where the outer ring of bonding pads 14 do not overlie the input output circuitry, and to the configuration as depicted in FIG. 10, where both the outer ring of bonding pads 14 and the inner ring of bonding pads 16 overlie the input output circuitry. In each case, only those connectors 34 or 36 that have connectors 38 or 40 respectively routed between them need to be reduced in width to accommodate the routed connectors.

It is noted that another factor that can be adjusted is the width of the connector from one ring that runs either under or beside a bonding pad 14 or 16 of another ring on the same electrically conductive layer. By narrowing the width of the connector, the bonding pads can be placed closer together. However, it is more preferred to route the connectors past the bonding pads by placing the bonding pads on one layer and the connectors on another layer.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, comprising:
    a substrate with circuitry formed therein, the substrate having a peripheral edge,
    a top most electrically conductive layer,
    an underlying electrically conductive layer,
    electrically conductive outer bonding pads disposed in an outer ring adjacent the peripheral edge of the substrate, the outer bonding pads formed within the top most electrically conductive layer, the outer bonding pads having a first width,
    electrically conductive inner bonding pads disposed in an inner ring interior to and concentric with the outer ring of bonding pads, the inner bonding pads formed within the top most electrically conductive layer, the inner bonding pads having a second width,
    electrically conductive inner connectors adapted to electrically connect the inner bonding pads to the circuitry, the inner connectors formed within the underlying electrically conductive layer, the inner connectors having a third width that is less than the second width of the inner bonding pads, thereby defining a gap having a fourth width between the inner connectors, and
    electrically conductive outer connectors adapted to electrically connect the outer bonding pads to the circuitry, the outer connectors formed within the underlying electrically conductive layer, the outer connectors having a fifth width that is less than the fourth width of the gap between the inner connectors.

2. The integrated circuit of claim 1, wherein adjacent ones of the inner bonding pads are disposed at a pitch that is narrower than the fifth width of the outer connectors.

3. The integrated circuit of claim 1, wherein the first width of the outer bonding pads is equal to the second width of the inner bonding pads.

4. The integrated circuit of claim 1, wherein adjacent ones of the outer bonding pads are disposed at a first pitch and adjacent ones of the inner bonding pads are disposed at a second pitch and the first pitch is equal to the second pitch.

5. The integrated circuit of claim 1, wherein the underlying electrically conductive layer is a first electrically conductive layer below the top most electrically conductive layer.

6. The integrated circuit of claim 1, wherein the outer ring of bonding pads and the inner ring of bonding pads include all bonding pads of the integrated circuit.

7. The integrated circuit of claim 1, wherein the inner ring of bonding pads is disposed over the circuitry of the integrated circuit.

8. The integrated circuit of claim 1, wherein the outer ring of bonding pads is disposed over the circuitry of the integrated circuit.

9. The integrated circuit of claim 1, wherein the inner connectors comprise vias to the circuitry.

10. A packaged integrated circuit including the integrated circuit of claim 1.

11. An integrated circuit, comprising:

a substrate with circuitry formed therein, the substrate having a peripheral edge, a top most electrically conductive layer, an underlying electrically conductive layer, electrically conductive outer bonding pads disposed in an outer ring adjacent the peripheral edge of the substrate, the outer bonding pads formed within the top most electrically conductive layer, the outer bonding pads having a first width, electrically conductive inner bonding pads disposed in an inner ring interior to and concentric with the outer ring of bonding pads, the inner bonding pads formed within the top most electrically conductive layer, the inner bonding pads having a second width, the inner bonding pads disposed over the circuitry of the integrated circuit, electrically conductive inner connectors adapted to electrically connect the inner bonding pads to the circuitry without routing between the outer bonding pads, the inner connectors formed within the underlying electrically conductive layer, and electrically conductive outer connectors adapted to electrically connect the outer bonding pads to the circuitry without routing between the inner bonding pads, the outer connectors formed within the underlying electrically conductive layer.

12. The integrated circuit of claim 11, wherein the first width of the outer bonding pads is equal to the second width of the inner bonding pads.

13. The integrated circuit of claim 11, wherein adjacent ones of the outer bonding pads are disposed at a first pitch and adjacent ones of the inner bonding pads are disposed at a second pitch and the first pitch is equal to the second pitch.

14. The integrated circuit of claim 11, wherein the inner connectors comprise vias to the circuitry.

15. A packaged integrated circuit including the integrated circuit of claim 11.

16. An integrated circuit, comprising:

a substrate with circuitry formed therein, the substrate having a peripheral edge, a top most electrically conductive layer, an underlying electrically conductive layer, electrically conductive outer bonding pads disposed in an outer ring adjacent the peripheral edge of the substrate, the outer bonding pads formed within the top most electrically conductive layer, the outer bonding pads having a first width, the outer bonding pads disposed over the circuitry of the integrated circuit, electrically conductive inner bonding pads disposed in an inner ring interior to and concentric with the outer ring of bonding pads, the inner bonding pads formed within the top most electrically conductive layer, the inner bonding pads having a second width, the inner bonding pads disposed over the circuitry of the integrated circuit, electrically conductive outer connectors adapted to electrically connect the outer bonding pads to the circuitry, the outer connectors formed within the underlying electrically conductive layer, the outer connectors having a fifth width that is less than the first width of the outer bonding pads, thereby defining a gap having a fourth width between the outer connectors, and electrically conductive inner connectors adapted to electrically connect the inner bonding pads to the circuitry, the inner connectors formed within the underlying electrically conductive layer, the inner connectors having a third width that is less than the fifth width of the gap between the outer connectors.

17. The integrated circuit of claim 16, wherein adjacent ones of the outer bonding pads are disposed at a pitch that is narrower than the third width of the inner connectors.

18. The integrated circuit of claim 16, wherein the first width of the outer bonding pads is equal to the second width of the inner bonding pads.

19. The integrated circuit of claim 16, wherein adjacent ones of the outer bonding pads are disposed at a first pitch and adjacent ones of the inner bonding pads are disposed at a second pitch and the first pitch is equal to the second pitch.

20. A packaged integrated circuit including the integrated circuit of claim 16.

* * * * *